United States Patent [19]
Swartz et al.

[11] 3,882,419
[45] May 6, 1975

[54] VARACTOR TUNED IMPATT DIODE MICROWAVE OSCILLATOR

[75] Inventors: George Allan Swartz, Princeton; Cheng Paul Wen, Trenton, both of N.J.

[73] Assignee: RCA Corporation, New York, N.Y.

[22] Filed: Mar. 1, 1974

[21] Appl. No.: 447,221

[52] U.S. Cl. ............ 331/96; 331/107 R; 331/177 V
[51] Int. Cl. ............ H03b 7/14
[58] Field of Search ......... 331/96, 97, 107 R, 107 G, 331/177 V; 332/30 V

[56] References Cited

UNITED STATES PATENTS

| | | | |
|---|---|---|---|
| 3,628,185 | 12/1971 | Evans et al. | 331/101 X |
| 3,705,364 | 12/1972 | Takeshima | 331/107 G X |
| 3,820,039 | 6/1974 | Farrer | 331/177 V X |

OTHER PUBLICATIONS

Lee et al., The Bell System Technical Journal, January 1969, pp. 143–150, (331–107 R).

*Primary Examiner*—Siegfried H. Grimm
*Attorney, Agent, or Firm*—Edward J. Norton; Joseph D. Lazar; Michael A. Lechter

[57] ABSTRACT

A waveguide section having a moveable short-circuiting piston at one end contains two electrically coupled cavity resonators. A microwave generating element is disposed within one of the cavity resonators and a variable reactance element is disposed within the other cavity resonator. The frequency of the microwave output is controlled by varying the reactance of the variable reactance element.

5 Claims, 2 Drawing Figures

VARACTOR TUNED IMPATT DIODE MICROWAVE OSCILLATOR

BACKGROUND OF THE INVENTION

The present invention relates to a microwave generating device and more particularly to a microwave oscillator having a tunable output frequency.

Traditionally, frequency control of the output of a microwave oscillator utilizing a microwave generating element, such as a semiconductor diode operating in the impatt mode, has been accomplished in one of three ways. One method entails the use of a moveable short-circuiting piston at one end of a waveguide section containing an impatt diode within a tapered disc cavity resonator. The piston is mechanically positioned to obtain a generated microwave output which is resonant with the resonator. This method of tuning the output, although satisfactory for coarse tuning, presents difficulties when precise fine tuning is required.

Another method entails the use of a moveable short-circuiting piston at one end of a waveguide section containing an impatt diode within a circular disc cavity resonator. The output frequency is controlled by varying the height of the circular disc cavity. Once the desired frequency is obtained, the position of the piston is adjusted until the output peaks. This method of frequency control also presents difficulties in applications where precise fine tuning is required.

A third method of tuning the output frequency is to place a variable reactance element, such as a varactor diode, in the same cavity with the microwave generating element. The variable reactance element is placed in close physical proximity to the microwave generating element, usually less than a wavelength of the output frequency. Changing the voltage applied to the varactor diode changes its capacitance which in turn changes the capacitance of the resonator. A change in capacitance of the resonator changes its resonance frequency and, since the microwave generating element is also located within the same resonator, the microwave output frequency is correspondingly changed. The principal disadvantage associated with this method is that, since the microwave generating element and variable reactance element are located in the same cavity resonator within a wavelength of each other, operation at millimeter wave frequencies imposes extreme physical limitations on the device. The higher the frequency, the smaller the separation between the two elements and the more difficult it becomes to physically make the necessary electrical and mechanical connections to the elements.

SUMMARY OF THE INVENTION

A frequency tuned microwave oscillator includes a waveguide section having a moveable short-circuiting piston at one end. Two electrically coupled cavity resonators are located within the waveguide section. A microwave generating element is disposed within one of the cavity resonators and a variable reactance element is disposed within the other.

DETAILED DESCRIPTION

Figure 1:
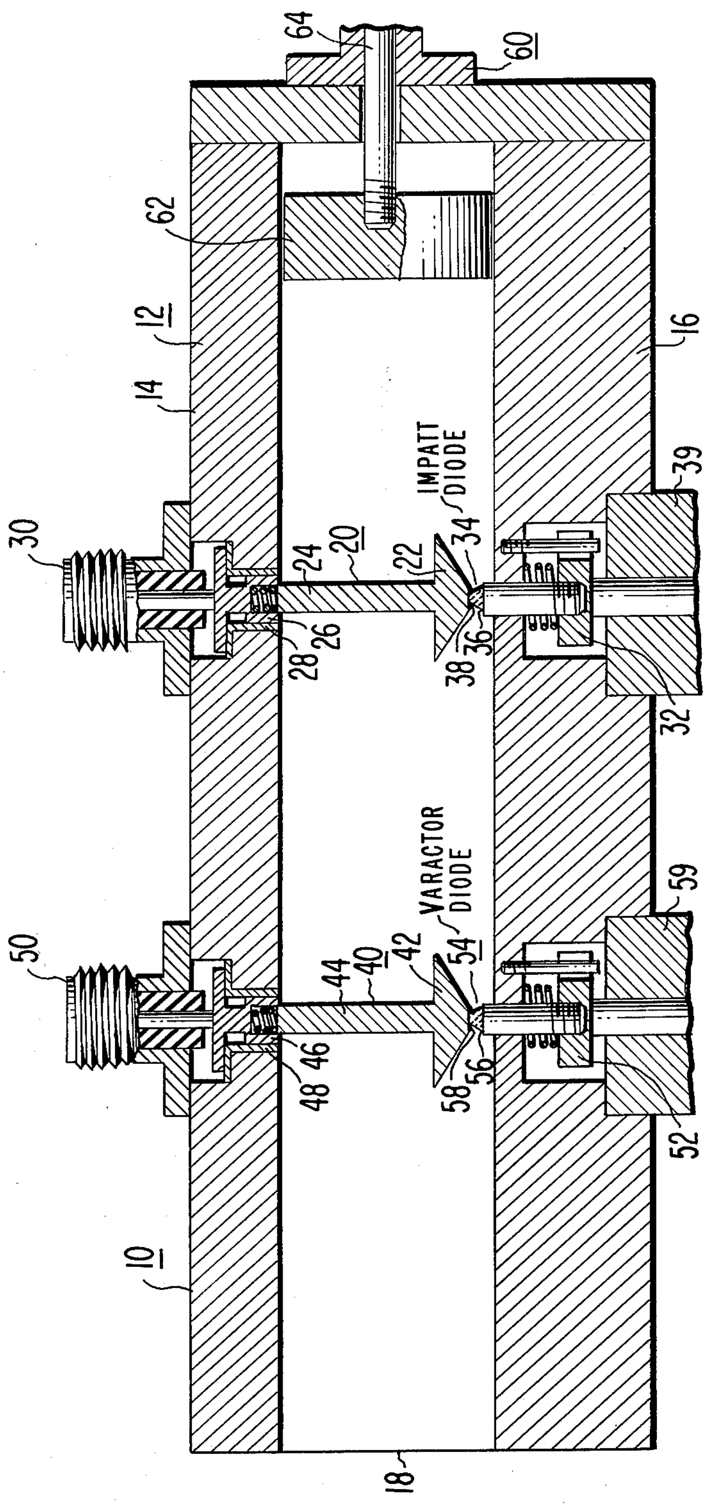
FIG. 1 is a sectional view taken along the midline of the preferred embodiment of the present invention.
Figure 2:
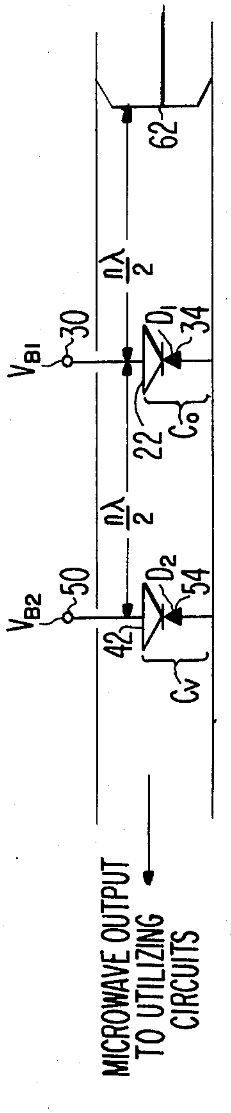
FIG. 2 is a schematic diagram of the preferred embodiment of the present invention.

Referring to FIGS. 1 and 2 of the drawing, there is shown a frequency tuned microwave oscillator generally designated as 10. The frequency tuned microwave oscillator 10 includes a waveguide section generally designated as 12. The waveguide section 12 comprises a top wall 14, a bottom wall 16 and a microwave signal output port 18. A first radial cavity resonator, generally designated as 20, is mechanically connected to the top wall 14 of the waveguide section 12. The first radial cavity resonator 20 comprises a circulator tapered disc 22, a spring-loaded mounting post 24 and a cavity mounting assembly 26. The circular tapered disc is electrically and mechanically connected to the spring-loaded mounting post 24 which is in turn electrically and mechanically connected to the cavity mounting assembly 26. The cavity mounting assembly 26 is DC insulated from the waveguide section 12 by means of an insulating bushing 28. An impatt diode bias voltage connector 30 is mounted on the upper surface of the top wall 14 of the waveguide section 12. The center conductor of the impatt diode bias voltage connector is electrically connected to the cavity mounting assembly 26.

A spring-loaded impatt diode mounting assembly 32 is mounted in and electrically connected to the bottom wall 16 of the waveguide section 12. An impatt diode, generally designated as 34, having an anode electrode 36 and a cathode electrode 38, is mounted on the spring-loaded impatt diode mounting assembly 32. The anode electrode 36 is electrically and mechanically connected, such as by soldering or brazing to the spring-loaded impatt diode mounting assembly 32. The position of the mounted impatt diode 34 is adjusted using a micrometer drive 39 (partially shown) until the cathode electrode 38 of the impatt diode 34 makes physical and electrical contact with the circular tapered disc 22.

A second radial cavity resonator, generally designated as 40, is mounted on the top wall 14 of the waveguide section 12. The second radial cavity resonator 40 comprises a circular tapered disc 42, a spring-loaded mounting post 44 and a cavity mounting assembly 46. The circular tapered disc 42 is electrically and mechanically connected to the spring-loaded mounting post 44 which in turn is electrically and mechanically connected to the cavity mounting assembly 46. The cavity mounting assembly 46 is DC insulated from the waveguide section 12 by an insulating bushing 48. A varactor diode bias signal connector 50 is mounted on the upper surface of the top wall 14 of the waveguide section 12. The center conductor of varactor diode bias signal connector 50 is electrically connected to the cavity mounting assembly 46. A spring-loaded varactor diode mounting assembly 52 is mounted in and electrically connected to the bottom wall 16 of the waveguide section 12. A varactor diode 54, having an anode electrode 56 and a cathode electrode 58, is mounted on the spring-loaded varactor diode mounting assembly 52. The anode electrode 56 is electrically and mechanically connected, such as by soldering or brazing, to the spring loaded varactor diode mounting assembly 52. The position of the mounted varactor diode 54 is adjusted using a micrometer drive 59 (partially shown) until the cathode electrode 58 makes physical and electrical contact with the circular tapered disc 42.

A moveable short-circuiting piston assembly, generally designated as 60, is mounted at the end of the waveguide section 12 opposite the microwave signal output port 18. The moveable short-circuiting piston assembly 60 comprises a short-circuiting piston 62 and a piston position adjustment assembly 64.

A DC power source is attached to the impatt diode bias voltage connector 30. Since the center conductor of the impatt diode bias voltage connector 30 is electrically connected to the cathode electrode 38 of the impatt diode 34 through the cavity mounting assembly 26, the spring-loaded mounting post 24 and the circular tapered disc 22, DC voltage applied to the impatt diode bias voltage connector will appear at the cathode electrode 38 of the impatt diode 34. The output of the DC power source is increased until the DC voltage applied to the cathode electrode 38 of the impatt diode 34 exceeds a predetermined threshold value at which point the impatt diode 34 is triggered into the impatt mode of operation, causing the impatt diode to generate a microwave signal at a predetermined frequency. The circular tapered disc 22 forms the top of a radial cavity resonator, the bottom of which is formed by the inner surface of the bottom wall 16 of the waveguide section 12. This radial cavity resonator is designed to resonate at the microwave frequency generated by the impatt diode 34.

A DC power source is also connected to the varactor diode bias signal connector 50. Since the center conductor of the varactor diode bias signal connector 50 is electrically connected to the cathode electrode 58 of the varactor diode 54 through the cavity mounting assembly 46, the spring-loaded mounting post 44 and the circular tapered disc 42, the DC voltage which is applied at the varactor diode bias signal connector appears at the cathode electrode 58 of the varactor diode 54. The capacitance of the varactor diode 54 will vary as a function of the level of the DC voltage applied at the varactor diode bias signal connector 50.

Referring to FIG. 2, there is shown a schematic diagram of the frequency tuneable microwave oscillator 10. $D_1$ represents the impatt diode 34 and $D_2$ represents the varactor diode 54. $V_{B1}$ represents the impatt bias voltage applied at the impatt diode bias voltage connector 30 and $V_{B2}$ represents the varactor bias voltage applied at the varactor bias signal connector 50. $C_V$ indicates the varactor cavity formed by the tapered disc 42 and $C_o$ indicates the oscillator cavity formed by the tapered disc 22.

When $V_{B1}$ exceeds the predetermined threshold value referred to previously, the impatt diode $D_1$ generates a microwave signal. Without the varactor diode present, the operating frequency would be dependent on the impatt diode properties, the diameter of the tapered disc 22, the height of the circular cavity formed by the tapered disc 22 and the distance between the impatt diode and the waveguide shorting piston 62. With the varactor diode $D_2$ in the varactor cavity $C_V$ as shown, the power reflected into the oscillator cavity $C_o$ is the vector sum of the power reflected from the short-circuiting piston 62 and the power reflected from the varactor cavity. The phase of the power reflected from the varactor cavity $C_V$ is a function of the varactor capacitance. Changing the varactor capacitance by increasing or decreasing the varactor bias voltage $V_{B2}$ changes the phase of the power, at a particular frequency, reflected into the oscillator cavity $C_o$. The oscillator shifts its resonance to keep the reflected phase constant. Consequently, the change in the varactor bias voltage $V_{B2}$ changes the frequency of the oscillator.

As indicated in FIG. 2, the distance between the varactor diode 54 and the impatt diode 34 is substantially equal to $n\lambda/2$ where $n$ is a positive integer and $\lambda$ is the wavelength of the operating frequency. Maximization of the microwave signal output power is accomplished by varying the position of the short-circuiting piston 62. Consequently, the distance between the impatt diode 34 and the short-circuiting piston 62 is variable, having a nominal value of $n\lambda/2$. Although the apparatus can be operated with $n$ being any integer, ideally the value of n should be either 1 or 2 for optimum frequency control.

The principal advantage of the frequency tuned microwave oscillator disclosed herein is that electronic tuning of the output frequency is accomplished without the extreme physical access limitations inherent in previous designs in which the microwave generating and variable reactance elements were located within the same cavity. Employing separate, RF coupled cavities for each element allows the use of small cavities which in turn permits operation of the frequency tuned oscillator at higher frequencies.

We claim:

1. A frequency tuned microwave oscillator comprising:

a waveguide section having a moveable short-circuiting piston at one end;

first and second electrically coupled radial cavity resonators within said waveguide section, each of said resonators being formed by a circular disc mounted on one wall of said waveguide section and the opposite wall of said waveguide section, said disc having a tapered surface facing said opposite wall and defining thereby the cavity of said resonator;

said second cavity resonator being positioned in said waveguide section between said first cavity resonator and said moveable short circuiting piston and separated from said first cavity resonator by a distance which is substantially equal to an integral number of half-wavelengths of the generated microwave signal;

said moveable short-circuiting piston being adjusted to be separated from said second cavity resonator by a distance which is substantially equal to an integral number of half-wavelengths of the generated microwave signal;

a microwave generating element disposed within said first cavity resonator; and a variable reactance element disposed within said second cavity resonator.

2. A microwave apparatus in accordance with claim 1 in which the microwave generating element comprises a semiconductor diode operating in an impatt mode, said diode having an anode electrode and a cathode electrode.

3. A microwave apparatus in accordance with claim 2 having means for applying a bias signal, exceeding a predetermined threshold value, across the electrodes of said diode, to effect said diode being triggered into said impatt mode of operation.

4. A microwave apparatus in accordance with claim 1 in which the variable reactance element comprises a varactor diode, said diode having an anode electrode and a cathode electrode, and having a junction capacitance which varies as a function of a bias voltage applied across said electrodes.

5. A microwave apparatus in accordance with claim 4 having means for applying a variable DC bias voltage across the electrodes of said varactor diode to effect said variance in junction capacitance.

* * * * *